United States Patent

Lee

[11] Patent Number: 6,083,822
[45] Date of Patent: Jul. 4, 2000

[54] FABRICATION PROCESS FOR COPPER STRUCTURES

[75] Inventor: Tze-Liang Lee, Hsin-Chu, Taiwan

[73] Assignee: Industrial Technology Research Institute, Hsin-Chu, Taiwan

[21] Appl. No.: 09/373,243

[22] Filed: Aug. 12, 1999

[51] Int. Cl.[7] .............................................. H01L 21/4763
[52] U.S. Cl. .................... 438/624; 438/637; 438/638; 438/634; 438/700; 257/750; 257/774; 257/762
[58] Field of Search ..................................... 438/624, 638, 438/637, 675, 700, 740, 597, 622, 633, 634, 618

[56] References Cited

U.S. PATENT DOCUMENTS

| | | | |
|---|---|---|---|
| 5,612,254 | 3/1997 | Mu et al. | 438/631 |
| 5,635,423 | 6/1997 | Huang et al. | 438/624 |
| 5,686,354 | 11/1997 | Avanzino et al. | 438/625 |
| 5,741,626 | 4/1998 | Jain et al. | 430/314 |
| 5,801,094 | 9/1998 | Yew et al. | 438/624 |
| 5,877,076 | 3/1999 | Dai | 438/597 |
| 5,966,634 | 10/1999 | Inohara et al. | 438/687 |
| 5,989,997 | 11/1999 | Lin et al. | 438/622 |

*Primary Examiner*—Charles Bowers
*Assistant Examiner*—Hsien-Ming Lee
*Attorney, Agent, or Firm*—George O. Saile; Stephen B. Ackerman

[57] ABSTRACT

A process for creating a dual damascene opening, in a composite insulator layer, to be used to accommodate a dual damascene copper structure, has been developed. The process features the use of a composite insulator layer, comprised with silicon oxide layers, and with multiple silicon nitride layers, used as stop layers, during selective, anisotropic RIE procedures, used to create the dual damascene opening, in the composite insulator layer. The multiple silicon nitride stop layers, are maintained at minimum thicknesses, to still allow selective formation of the dual damascene opening, however avoiding the capacitance increases, encountered with thicker silicon nitride counterparts. A dual damascene copper structure, formed in the dual damascene opening, exhibits minimum RC delays, as a result of the use of low resistivity copper, and as a result of the use of a minimum of silicon nitride etch stop layers, in the composite insulator.

27 Claims, 4 Drawing Sheets

FABRICATION PROCESS FOR COPPER STRUCTURES

Related Patent Application—"A MODIFIED DUAL DAMASCENE PROCESS", by K. C. Lin, of ERSO, (Industrial Technical Research Institute), invention disclosure—Ser. No. 09/206/738, filed on Dec. 7, 1998, (May 14, 1998), assigned to a common assignee.

BACKGROUND OF THE INVENTION (1) Field of the Invention

The present invention relates to processes used to fabricate semiconductor devices, and more specifically to a method used to create a dual damascene opening, in an insulator layer, used to accommodate copper interconnect, and copper via structures.

(2) Description of the Prior Art

The use of sub-micron features, or micro-miniaturization, has allowed the semiconductor industry to increase device density for very large scale integrated, (VLSI), semiconductor chips. The evolution to micro-miniaturization has been highlighted by advances in specific semiconductor fabrication disciplines such as photolithography, and dry etching. The development of mode sophisticated exposure cameras, as well as the use of more photo-sensitive materials, have allowed sub-micron images, in photoresist layers, to be routinely obtained. In addition the advent of advanced dry etching tools, and processes, have in turn allowed the sub-micron images, in masking photoresist layers, to be successfully transferred to underlying materials, used in the fabrication of VLSI chips. However to continue to decrease the size of semiconductor chips, specific process or structural innovations, are also needed, in addition to the advances in specific semiconductor fabrication disciplines. One such process innovation has been the use of dual damascene patterning, for attainment of metal lines and metal vias. The dual damascene procedure features the creation of a pattern, opened in an insulator layer, with the dual damascene pattern comprised of an underlying narrow diameter opening, and a wider diameter, overlying opening. Filling of the dual damascene opening, in the insulator layer, with metal, results in a metal structure comprised of a metal interconnect structure, located in the wider diameter opening, overlying a metal via structure, located in the narrower diameter opening, in the dual damascene opening. The dual damascene procedure, in which both metal interconnects, and metal vias, are formed using a single metal fill, and only one metal patterning, or removal procedure, offers advantages over conventional procedures, in which a metal fill, and a metal patterning procedure, would have to be individually formed for both the metal via structure, and the metal interconnect structure.

A critical step, used for creation of a dual damascene opening, is the ability to form, or to terminate, the wider diameter opening, in a top portion of an insulator layer, without transferring this wider diameter opening, to the bottom portion of the insulator layer, where the narrow diameter opening is to be formed. One method used to address this concern is the use of a stop layer, which will subsequently reside between a first interlevel dielectric, (ILD), layer, and a second ILD layer. After forming the desired narrow diameter opening, in the stop layer, which resides on the unetched lower, or first, ILD layer, a second, or upper ILD layer is deposited. A photoresist shape, featuring the wider diameter opening, is used as a mask to create the wider diameter opening, in the second ILD layer, exposing the stop layer, which is comprised with the narrow diameter image. A selective dry etch procedure, is used to form the wide diameter opening, in the second ILD layer, while the stop layer allows the narrow diameter opening, in the stop layer, to be transferred to the underlying first ILD layer, exposed in the narrow diameter opening, in the stop layer. However to successfully prevent unwanted etching of the first ILD layer, a thick stop layer, exhibiting a low removal rate in the dry etching process used for the insulator etching, is employed. Therefore if silicon oxide, with a low dielectric constant is used, for both of the ILD layers, the stop layer used is then usually comprised of silicon nitride, exhibiting a high dielectric constant, however allowing the desired dry etching selectivity to be realized. However since a thick, silicon nitride, stop layer, with a dielectric constant of about 7, is needed, unwanted capacitance results, increasing RC delays, and degrading device performance.

This invention will describe a novel process for forming a dual damascene opening, in ILD layers, to be used to accommodate metal interconnect, and metal via structures. However this invention will feature a reduction in the total thickness of the silicon nitride stop layer, when compared to prior arts, using thicker silicon nitride layers, thus minimizing capacitance. This invention will feature the use of multiple silicon nitride stop layers, strategically placed between silicon oxide, insulator layers, however still thinner, and thus less performance degrading, than counterparts using a single, but thicker, silicon nitride stop layer. The insulator stack, to be subsequently patterned to obtain the dual damascene opening, is comprised of a lower, or first ILD layer, to subsequently contain the narrow diameter via hole, however a thin, first silicon nitride layer, is used to separate a lower, and an upper portion, of the first ILD layer. The insulator stack is also comprised of an upper, or second ILD layer, overlying a second silicon nitride stop layer, which in turn resides on the top surface of the upper portion, of the first ILD layer. This configuration allows selective RIE procedures, to create a wide diameter opening in the second ILD layer, and in the second silicon nitride layer, while creating the desired narrow diameter opening in the first ILD layer, including the first silicon nitride stop layer. The sum of the thicknesses of the silicon nitride layers, is less than for counterpart, dual damascene processes, using a thicker, single silicon nitride stop layer. Prior art, such as Avanzino et al, in U.S. Pat. No. 5,686,354, as well as Huang et al, in U.S. Pat. No. 5,635,423, describe dual damascene processes, however these prior art do not show the multiple stop layers, used in the present invention, offering less capacitance than counterparts described using a thicker, single silicon nitride stop layer.

SUMMARY OF THE INVENTION

It is an object of this invention to fabricate metal interconnect structures, and underlying metal via structures, using a dual damascene process.

It is another object of this invention to create the dual damascene opening, in a composite insulator layer comprised of a low dielectric constant, insulator layers, and comprised of multiple, thin, silicon nitride layers, located at various levels, of the composite insulator layer.

It is yet another object of this invention to use a thin, first, silicon nitride layer, as a stop layer, during the first phase of the dual damascene patterning procedure, allowing an initial, narrow diameter opening to be formed in the upper portion of the composite insulator layer, while using the second silicon nitride layer, as a stop layer, during the second phase of the dual damascene patterning procedure, allowing the creation of the wide diameter opening, to be accomplished in an upper portion of the composite insulator layer, and also resulting in the creation of a final, narrow diameter opening, formed in a lower portion of the composite insulator layer, using the narrow diameter opening, in the second silicon nitride layer, as a mask.

In accordance with the present invention a process for creating a dual damascene opening, in a composite insulator layer, used to accommodate a subsequent dual damascene metal structure, and featuring the use of multiple, thin silicon nitride layers, used as etch stops during the dual damascene, dry etching procedure, is described. After formation of a barrier layer, on an underlying, metal interconnection structure, a composite insulator layer comprised of: a first insulator layer, such as silicon oxide; a thin, first silicon nitride layer; a second insulator layer, such as silicon oxide; a second silicon nitride layer; and a third insulator layer, such as silicon oxide; is deposited. A first photolithographic and first dry etching procedure is used to create an initial, narrow diameter opening in: the third insulator layer; in the second silicon nitride layer; in the second insulator layer; and in the thin, second silicon nitride layer. The etch rate ratio of the silicon oxide, insulator layer, to silicon nitride, allows the first dry etching procedure to successfully terminate at the appearance of the first insulator layer. A second photolithographic and second dry etching procedure is then employed to create a wide diameter opening in the third insulator layer, using the second silicon nitride layer as an etch stop, as well as a masking pattern, to transfer the initial, narrow diameter opening, in the second silicon nitride layer, to the lower portion of the composite insulator ILD layer. The second silicon nitride layer performed as the etch stop, during the selective, second dry etching procedure, preventing erosion of the lower portion of the composite insulator layer, preserving the desired final, narrow diameter opening. Selective removal of the barrier layer, exposed at the bottom of the dual damascene opening, results in removal of portions of the second silicon nitride layer, exposed in the wide diameter opening. After removal of the defining photoresist shapes, a metal layer is deposited completely filling the dual damascene opening, in the composite insulator layer. Removal of unwanted metal, from the top surface of the third insulator layer, results in the dual damascene metal structure, comprised of a metal interconnect structure, in the wide diameter opening, overlying a metal via structure, located in the narrow diameter opening, contacting the underlying first metal interconnect structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating a dual damascene opening, in a composite insulator layer, comprised with insulator layers, such as silicon oxide, and with thin silicon nitride layers, with the dual damascene opening to be used to accommodate a subsequent dual damascene metal structure, will now be described in detail. The insulator layers, used in the composite insulator layer, can be a low dielectric layer, such as silicon oxide, or boro-phosphosilicate, with a dielectric constant of about 3.9. However lower dielectric constant materials, such as hydrogen silsesquioxane, (HSQ), with a dielectric constant between about 2.8 to 3.0, can be used to replace the silicon oxide layers, if lower capacitance, and enhanced performance is required.

Figure 1:
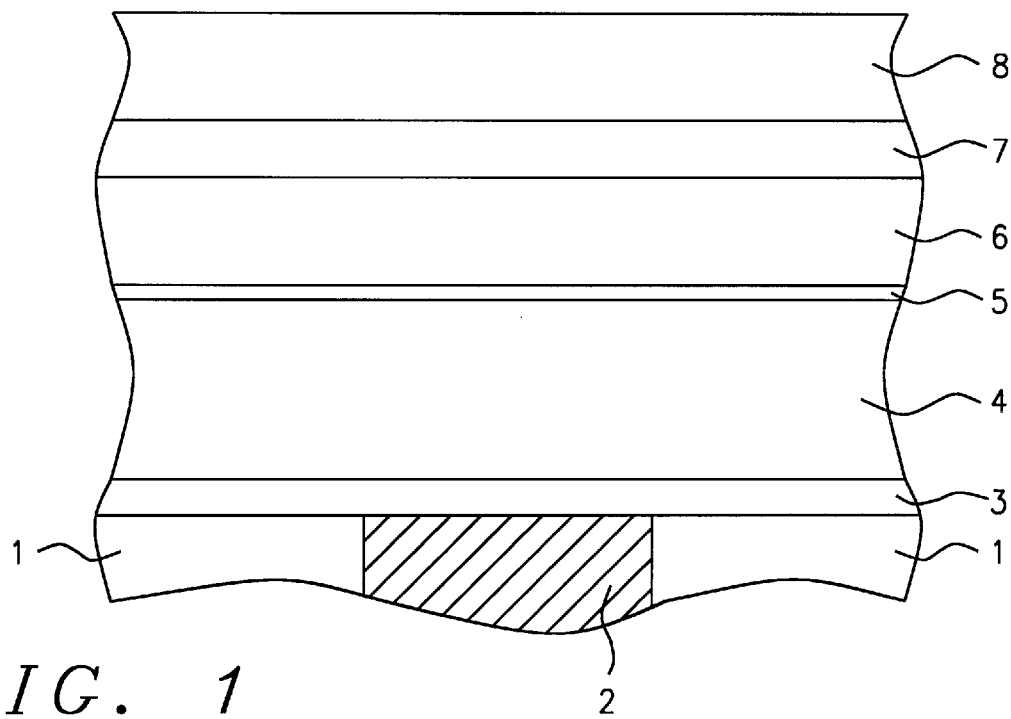
FIGS. 1–6, which schematically, in cross-sectional style, show the key stages of fabrication, used to create a dual damascene opening, in a composite insulator layer, comprised with insulator layers, such as silicon oxide, and with multiple silicon nitride layers, to allow the subsequent formation of a metal structure, to be comprised with a dual damascene shape.

FIG. 1, schematically, in cross-sectional style, show the composite insulator layer, that the dual damascene opening will be created in. First, silicon oxide layer 1, is subjected to a planarization procedure, using a chemical mechanical polishing, (CMP), procedure, to create a smooth top surface topography. After creating an opening in silicon oxide layer 1, via conventional photolithographic and reactive ion etching, (RIE), procedures, a metal interconnect structure 2, comprised of either copper, of an aluminum based layer, or of a refractory metal such as tungsten, is formed in the opening in silicon oxide layer 1. For this invention metal interconnect structure 2, will be comprised of copper, then necessitating the use of a composite adhesive—barrier layer, such as titanium—titanium nitride, (not shown in the drawings), to coat the sides of the opening in silicon oxide layer 1, prior to copper deposition, preventing copper poisoning of adjacent materials. After deposition of the adhesive—barrier layer, and of copper, via R.F. sputtering procedures, unwanted material is removed from the top surface of silicon oxide layer 1, via a CMP procedure, or via use of a selective RIE procedure, using a fluorine based gas, as an etchant.

After formation of copper interconnect structure 2, a barrier layer, or a metal passivation layer 3, such as silicon nitride layer, is deposited using either a low pressure chemical vapor deposition, (LPCVD), or plasma enhanced chemical vapor deposition, (PECVD), procedure, at a thickness between about 300 to 1000 Angstroms. Metal passivation layer, or silicon nitride layer 3, schematically shown in FIG. 1, is again used as a barrier layer, preventing copper from interacting with subsequent overlying materials. Silicon oxide layer 4, is next deposited, overlying silicon nitride, metal passivation layer 3. Silicon oxide layer 4, is obtained via LPCVD or PECVD procedures, at a thickness between about 5000 to 6000 Angstroms. A critical, thin, second silicon nitride layer 5, is then deposited, on silicon oxide layer 4, again via LPCVD or PECVD procedures, to a thickness between about 125 to 175 Angstroms. Second silicon nitride layer 5, shown schematically in FIG. 1, will provide an endpoint, for a subsequent first phase, of the dual damascene opening procedure. Another silicon oxide layer 6, is next deposited, again via LPCVD or PECVD procedures, at a thickness between about 3000 to 4000 Angstroms.

A third silicon nitride layer 7, to be used as an etch stop for creation of wide diameter opening, of the dual damascene opening, is next deposited via LPCVD or PECVD procedures, at a thickness between about 800 to 900 Angstroms, followed by the deposition of silicon oxide layer 8. Silicon oxide layer 8, schematically shown in FIG. 1, is obtained via LPCVD or PECVD procedures, at a thickness between about 5000 to 6000 Angstroms. The materials used for the composite insulator layer, such as silicon oxide layers, 4, 6, and 8, were chosen for their low dielectric constant, about 3.9, therefore minimizing the capacitance aspect of the RC delay. However to further decrease capacitance, silicon oxide layers can be replaced by lower dielectric constant materials, such as hydrogen silsisquioxane, (HSQ), with a dielectric constant between about 2.8 to 3.0. The HSQ layer would be applied via spin on procedures, and may be capped with a thin silicon oxide layer. The silicon nitride layers are used as etch stop layers, for termination of the silicon oxide dry etching procedures. However silicon nitride possesses a large dielectric constant, about 7.0, therefore it is the objective of this invention to maintain a low thickness for the silicon nitride stop layers, however still providing the needed thickness to function as an etch stop layer. This invention, featuring multiple levels, of thin silicon nitride layers, strategically placed in the composite insulator layer, allows a dual damascene opening to be successfully formed in the insulator layer, while still not significantly increasing the capacitance of the composite insulator layer.

Figure 2:
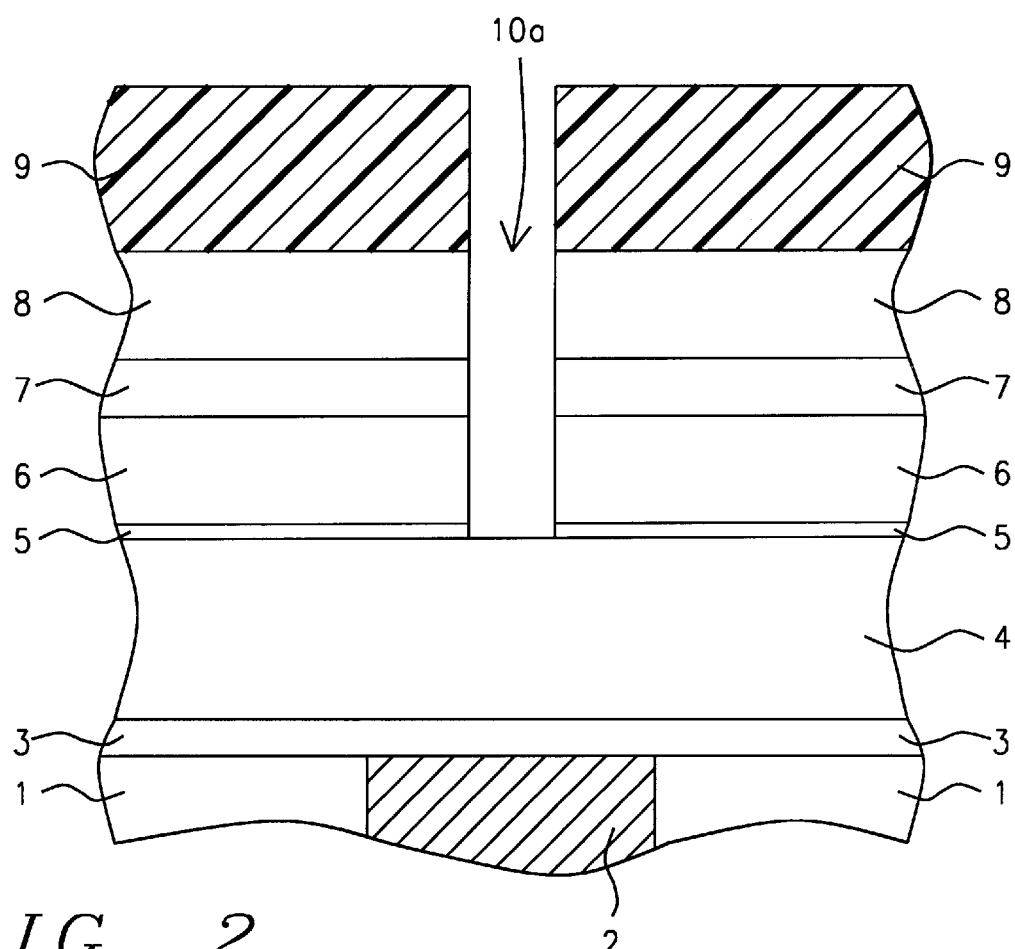

FIG. 2, schematically shows the formation of the initial, narrow diameter opening 10a, in the composite insulator layer. Photoresist shape 9, is used as an etch mask, to allow a first anisotropic RIE procedure, using $CHF_3$ as an etchant, to define an initial, narrow diameter opening 10a, in silicon oxide layer 8. The etch rate selectivity of silicon oxide to silicon nitride, using $CHF_3$, is about 2 to 1. Therefore at the appearance of silicon nitride layer 7, the etch chemistry, of the RIE procedure, is changed to a fluorine based chemistry, such as $CF_4$, $CH_2F_2$, or $CH_3F$, used to selectively remove the exposed regions of silicon nitride layer 7. The etch rate selectivity of silicon nitride to silicon oxide, in this etch environment is about 8 to 1, therefore an overetch cycle, used to insure complete removal of silicon nitride layer 7, will not remove a significant portion of silicon oxide layer 6. After anisotropic RIE removal of the exposed regions of silicon oxide layer 6, again using $CHF_3$ as an etchant, thin, silicon nitride layer 5, is etched, in the fluorine based chemistry, comprised of either $CF_4$, $CH_2F_2$, or $CH_3F$. The etch rate selectivity between thin silicon nitride layer, to underlying silicon oxide layer 4, allows termination of silicon nitride etching, with the appearance of silicon oxide layer 4. Initial, narrow diameter opening 10a, with a diameter between about 0.18 to 0.22 um, is shown schematically in FIG. 2.

Figure 3:
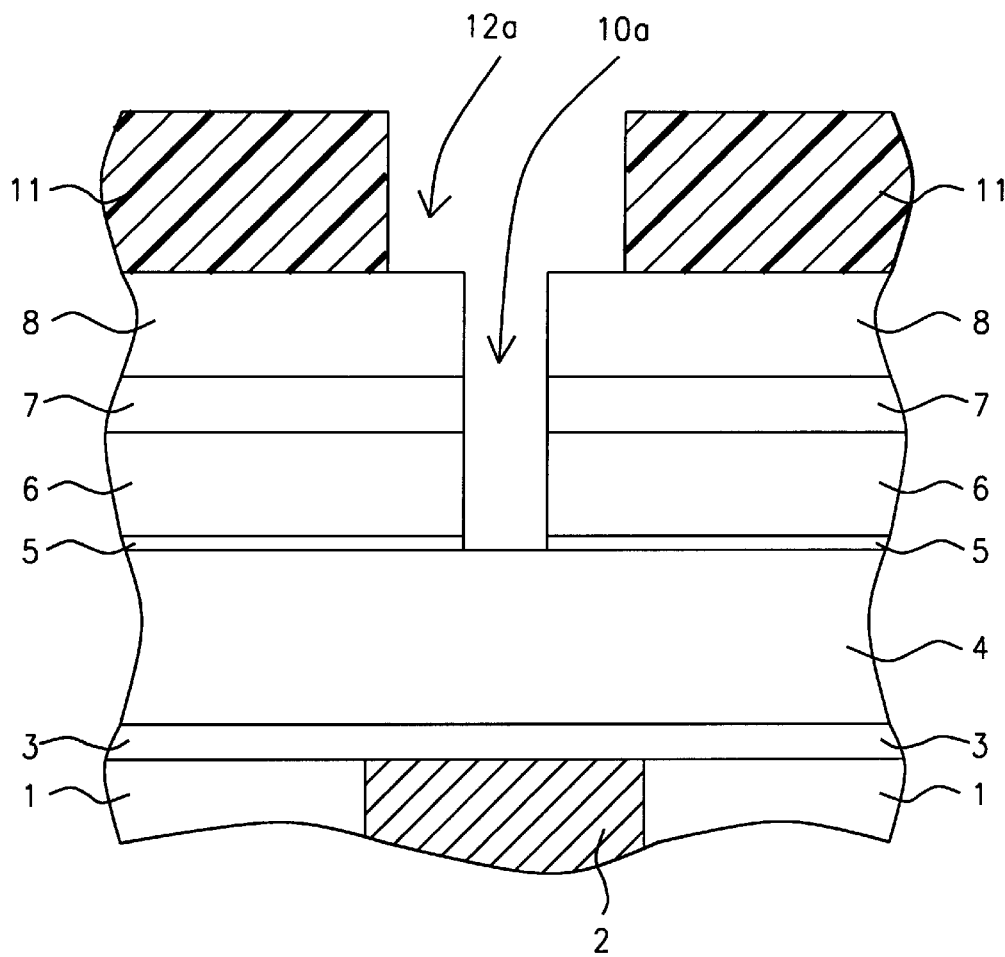
Figure 4:
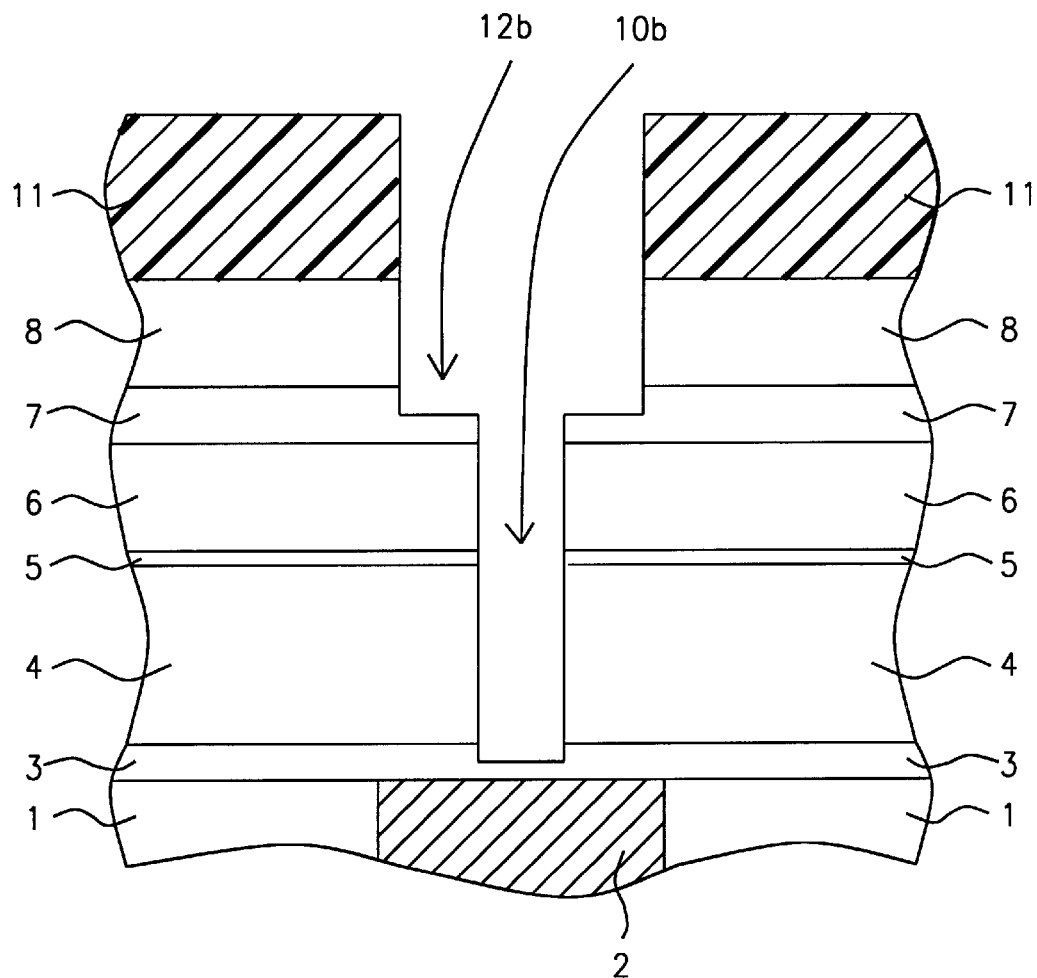

After removal of photoresist shape 9, via plasma oxygen ashing and careful wet cleans, photoresist shape 11, with large diameter opening 12a, is formed on the top surface of silicon oxide layer 8, with an opening 12a, in photoresist shape 11, between about 0.28 to 0.38 um, exposing initial, narrow diameter opening 10a, as well as exposing regions of silicon oxide layer 8. This is schematically shown in FIG. 3. A second anisotropic RIE procedure, using $CHF_3$ as an etchant, is used to create wide diameter opening 12b, in silicon oxide layer 8. The etch rate selectivity between silicon oxide layer 8, and underlying, silicon nitride layer 7, is about 2 to 1, allowing a silicon oxide overetch cycle to be performed, insuring the complete removal of silicon oxide layer 8, without breaking through silicon nitride stop layer 7. The ability of silicon nitride layer 7, to withstand the silicon oxide etch cycle, results in the desired result of wide diameter opening 12b, located only in the silicon oxide layer 8. This is shown schematically in FIG. 4. In addition to the creation of wide diameter opening 12b, the second anisotropic RIE procedure, used to create wide diameter opening 12b, in silicon oxide layer 8, also results in the removal of silicon oxide layer 4, exposed in initial, narrow diameter pattern, previously created in silicon nitride layer 7, thus creating final, narrow diameter opening 10b, now located in silicon oxide layer 4. Final, narrow diameter opening 10b, again exhibits a diameter between about 0.18 to 0.28 um. This can also be seen schematically in FIG. 4. The etching of silicon oxide layer 4, result in partial etching of regions of silicon nitride layer 7, exposed in wide diameter opening 12b. This is also shown schematically in FIG. 4.

Figure 5:
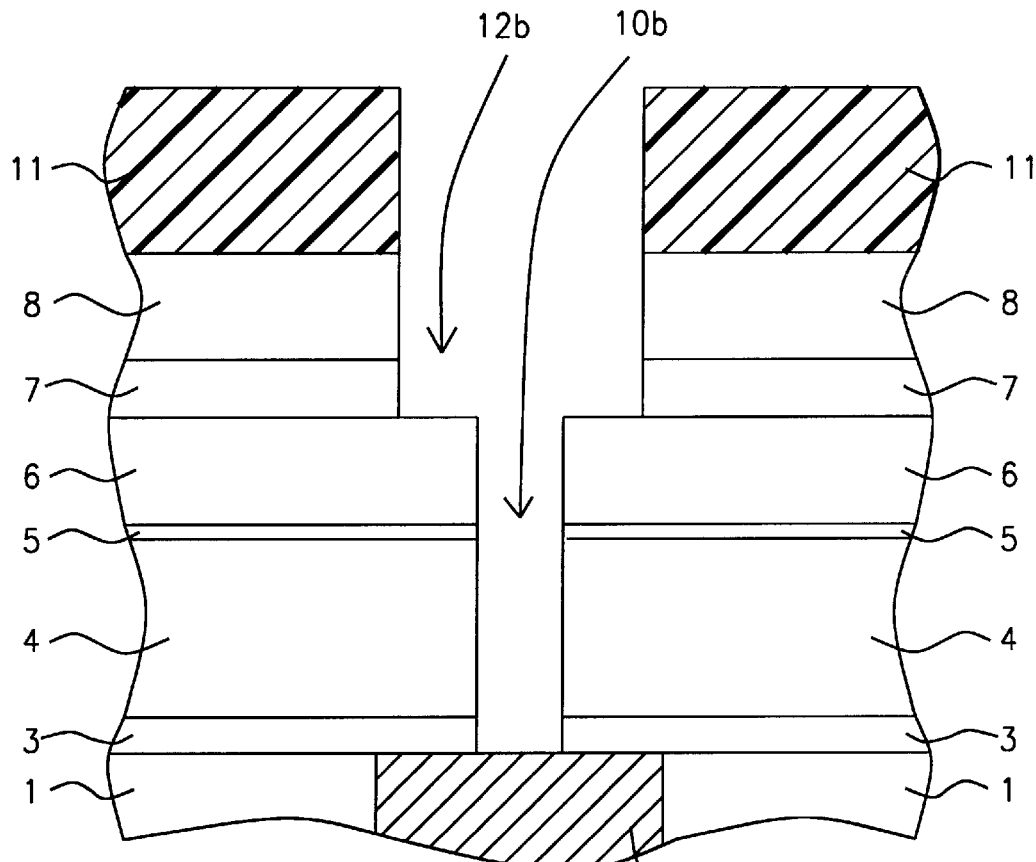

A final anisotropic RIE procedure is next employed to remove the region of silicon nitride layer 3, exposed in final, narrow diameter opening 10b. This is accomplished using the fluorine based chemistry, such as $CF_4$, or $CH_2F_2$, or $CH_3F$. This procedure also removes the thinned regions of silicon nitride layer 7, exposed in wide diameter opening 12b. This is schematically shown in FIG. 5. Photoresist shape 11, is then removed via plasma oxygen ashing and careful wet cleans.

Figure 6:
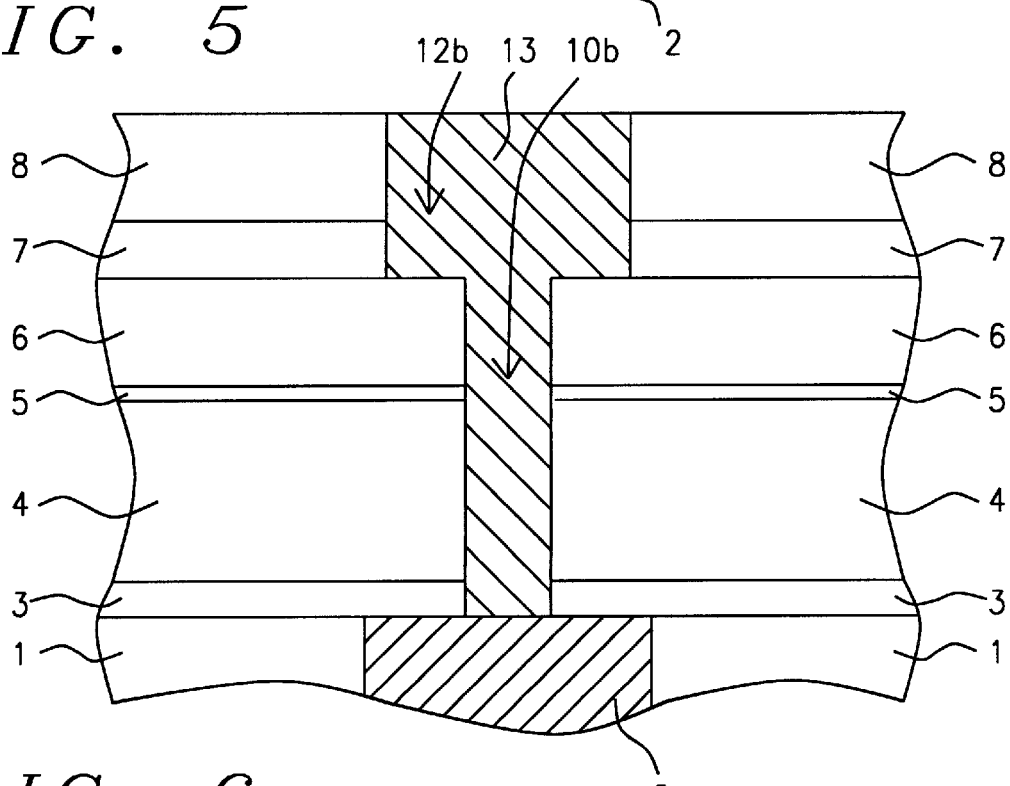

The dual damascene opening, comprised of wide diameter opening 12b, and underlying, final, narrow diameter opening 10b, created in a composite insulator layer, and using multiple layers of thin silicon nitride as stop layers, is now ready to accept the dual damascene metal structure. A layer of copper is deposited using either CVD or R.F. sputtering procedures, at a thickness between 10000 to 15000 Angstroms, completely filling the dual damascene opening, comprised of wide diameter opening 12b, and final, narrow diameter opening 10b. If desired, a barrier layer of tantalum, or tantalum nitride, can be deposited prior to deposition of the copper layer, coating the inside surfaces of the dual damascene opening. Removal of unwanted copper, and of unwanted barrier layer, if used, from the top surface of silicon oxide layer 8, is accomplished via a CMP procedure, creating metal dual damascene structure 13, schematically shown in FIG. 6. The creation of the dual damascene, copper structure 13, using only thin layers of silicon nitride, as stop layers, result in decreased RC delays as a result of improved conductivity of copper, compared to counterparts fabricated with a less conductive metal, and as a result of minimizing the amount of silicon nitride used.

While this invention has been particularly shown and described with reference to the preferred embodiments thereof, it will be understood by those skilled in the art that various changes in form details may be made without departing from the spirit and scope of this invention.

What is claimed is:

1. A method of fabricating a dual damascene metal structure, in a dual damascene opening, on a semiconductor substrate, wherein the dual damascene opening is formed in a composite insulator layer, comprising the steps of:

providing an underlying metal interconnect structure;

depositing a barrier layer;

depositing said composite insulator layer, on said barrier layer, with said composite insulator layer comprised of: an underlying, first insulator layer; a first silicon nitride layer; a second insulator layer; a second silicon nitride layer; and a third insulator layer;

using a first photoresist shape as a mask to form a first, initial diameter opening, in said third insulator layer, in said second silicon nitride layer, in said second insulator layer, and in said first silicon nitride layer;

using a second photoresist shape as a mask to form a final diameter opening in said third insulator layer, wherein said final diameter is wider than said first, initial diameter, while using said first, initial diameter opening, in said second silicon nitride layer, as a mask for removal of said first insulator layer, creating a second, initial diameter opening, of said dual damascene opening, comprised in said second silicon nitride layer, in said second insulator layer, in said first silicon nitride layer, in said first insulator layer, wherein diameter of said first, initial diameter opening, is equal to diameter of said second, initial diameter opening;

removing a region of said barrier layer, exposed at the bottom of said second, initial diameter opening, exposing a portion of the top surface of said underlying, metal interconnect structure, while also removing regions of said second silicon nitride layer, exposed in said final diameter opening; and forming said dual damascene metal structure, in said dual damascene opening, in said composite insulator layer, with said dual damascene metal structure, contacting the top surface of said underlying metal structure, located at the bottom of said dual damascene opening.

2. The method of claim 1, wherein said barrier layer is a silicon nitride layer, obtained via low pressure chemical vapor deposition, (LPCVD), or plasma enhanced chemical vapor deposition, (PECVD), procedures, at a thickness between about 300 to 1000 Angstroms.

3. The method of claim 1, wherein said first insulator layer is a silicon oxide layer, obtained via LPCVD or PECVD procedures, at a thickness between about 5000 to 6000 Angstroms.

4. The method of claim 1, wherein said first silicon nitride layer is obtained via LPCVD or PECVD procedures, at a thickness between about 125 to 175 Angstroms.

5. The method of claim 1, wherein said second insulator layer is a silicon oxide layer, obtained via LPCVD or PECVD procedures, at a thickness between about 3000 to 4000 Angstroms.

6. The method of claim 1, wherein said second silicon nitride layer is obtained via LPCVD or PECVD procedures, at a thickness between about 800 to 900 Angstroms.

7. The method of claim 1, wherein said third insulator layer is a silicon oxide layer, obtained via LPCVD or PECVD procedures, at a thickness between about 5000 to 6000 Angstroms.

8. The method of claim 1, wherein said first, initial diameter opening, is formed via an anisotropic reactive ion etching, (RIE), procedure, using $CHF_3$ as an etchant for said third insulator layer, and for said second insulator layer, with an etch rate selectivity of said third insulator layer, and of said second insulator layer, to said second silicon nitride layer, and to said first silicon nitride layer, of about 2 to 1, while a fluorine based chemistry, chosen from a group that contains $CF_4$, $CH_2F_2$, or $CH_3F$, is used as an etchant for said second silicon nitride layer, and for said first silicon nitride layer, with an etch rate selectivity of said second silicon nitride layer, and of said first silicon nitride layer, to said third insulator layer, and to said second insulator layer, of about 8 to 1.

9. The method of claim 1, wherein the diameter of said first initial diameter opening, and of said second, initial diameter opening, is between about 0.18 to 0.22 um.

10. The method of claim 1, wherein said final diameter opening, in said third insulator layer, is formed via an anisotropic RIE procedure, using $CHF_3$ as an etchant, with an etch rate selectivity of said third insulator layer, to said second silicon nitride layer, of about 2 to 1.

11. The method of claim 1, wherein the diameter of said final diameter opening, is between about 0.28 to 0.32 um.

12. The method of claim 1, wherein said barrier layer, exposed at the bottom of said second, initial diameter opening, and regions of said second silicon nitride layer, exposed in said final diameter opening, is removed via an anisotropic RIE procedure, using a fluorine based chemistry, chosen from a group that includes $CF_4$, $CH_2F_2$, or $CH_3F$, as an etchant, with an etch rate selectivity of said barrier layer, and of said second silicon nitride layer, to said third insulator layer, of about 8 to 1.

13. The method of claim 1, wherein said dual damascene metal structure, formed in said dual damascene opening, is comprised of copper.

14. A method of forming a dual damascene copper structure, in a dual damascene opening, created in a composite insulator layer, wherein said composite insulator layer is comprised of silicon oxide layers, and multiple silicon nitride, etch stop layers, comprising the steps of:

forming an underlying, metal interconnect structure;

depositing a first silicon nitride layer, overlying said underlying, metal interconnect structure;

depositing a first silicon oxide layer, on said first silicon nitride layer;

depositing a second silicon nitride layer, on said first silicon oxide layer;

depositing a second silicon oxide layer, on said second silicon nitride layer;

depositing a third silicon nitride layer, on said second silicon oxide layer;

depositing a third silicon oxide layer, on said third silicon nitride layer;

using a first photoresist shape as a mask, to anisotropically create a first, initial diameter opening, in said third silicon oxide layer, in said third silicon nitride layer, in said second silicon oxide layer, and in said second silicon nitride layer;

using a second photoresist shape as a mask, to anisotropically create a final diameter opening, in said third silicon oxide layer, wherein said final diameter is wider than said first, initial diameter, while using said first, initial diameter opening, in said third silicon nitride layer, as a mask, to create a second, initial diameter opening, in said third silicon nitride layer, in said second silicon oxide layer, in said second silicon nitride layer, and in said first silicon oxide layer, wherein diameter of said first, initial diameter opening is equal to diameter of said second, initial diameter opening, resulting in said dual damascene opening;

anisotropically removing the portion of said first silicon nitride layer, exposed at the bottom of said second, initial diameter opening, while anisotropically removing the regions of said third silicon nitride layer, exposed in said final diameter opening;

depositing a copper layer; and removing portions of copper layer from the top surface of said third silicon oxide layer, forming said dual damascene copper structure, in said dual damascene opening, in said composite insulator layer, with said dual damascene copper structure comprised of a copper interconnect structure, located in said wide diameter opening, and comprised of a copper via structure, located in said second, initial diameter opening.

15. The method of claim 14, wherein said first silicon nitride layer is obtained via LPCVD or PECVD procedures, at a thickness between about 300 to 1000 Angstroms.

16. The method of claim 14, wherein said first silicon oxide layer is obtained via LPCVD or PECVD procedures, at a thickness between about 5000 to 6000 Angstroms.

17. The method of claim 14, wherein said second silicon nitride layer is obtained via LPCVD or PECVD procedures, at a thickness between about 125 to 175 Angstroms.

18. The method of claim 14, wherein said second silicon oxide layer is obtained via LPCVD or PECVD procedures, at a thickness between about 3000 to 4000 Angstroms.

19. The method of claim 14, wherein said third silicon nitride layer is obtained via LPCVD or PECVD procedures, at a thickness between about 800 to 900 Angstroms.

20. The method of claim 14, wherein said third silicon oxide layer is obtained via LPCVD or PECVD procedures, at a thickness between about 5000 to 6000 Angstroms.

21. The method of claim 14, wherein the diameter of said first, initial diameter opening, and of said second, initial diameter opening, is between about 0.18 to 0.28 um.

22. The method of claim 14, wherein said first, initial diameter opening, is formed via an anisotropic RIE procedure, using $CHF_3$ as an etchant for said third silicon oxide layer, and for said second silicon oxide layer, while a fluorine based gas, chosen from a group that contains $C_F$, $CH_3F$, or $CH_2F_2$, is used as an etchant for said third silicon nitride layer, and for said second silicon nitride layer.

23. The method of claim 14, wherein the etch rate ratio of silicon oxide to silicon nitride, using $CHF_3$ as an etchant, is about 2 to 1.

24. The method of claim 14, wherein the etch rate ratio of silicon nitride to silicon oxide, in a fluorine based chemistry, chosen from a group that includes $CF_4$, $CH_2F_2$, or $CH_3F$, is about 8 to 1.

25. The method of claim 14, wherein said final diameter opening, is formed in said third silicon oxide layer, via an anisotropic RIE procedure, using $CHF_3$ as an etchant, with a etch rate ratio, of silicon oxide to silicon nitride, of about 2 to 1.

26. The method of claim 14, wherein the diameter of said final diameter opening, in said third silicon oxide layer, is between about 0.28 to 0.38 um.

27. The method of claim 14, wherein said first silicon nitride layer, exposed at the bottom of said second, initial diameter opening, and wherein regions of said third silicon nitride layer, exposed in said final diameter opening, are removed via an anisotropic RIE procedure, using a fluorine based chemistry, chosen from a group that includes $CF_4$, $CH_2F_2$, or $CH_3F$, as an etchant, with an etch rate ratio, of silicon nitride to silicon oxide, of about 8 to 1.

* * * * *